(12) United States Patent
Choi (10) Patent No.: US 6,458,627 B1
(45) Date of Patent: Oct. 1, 2002

(54) SEMICONDUCTOR CHIP PACKAGE AND METHOD OF FABRICATING SAME

(75) Inventor: Kwang Sung Choi, Seoul (KR)

(73) Assignee: Hyundai Micro Electronics Co., Ltd., Choongcheonbuk-Do (KR)

( * ) Notice: Subject to any disclaimer, the term of this patent is extended or adjusted under 35 U.S.C. 154(b) by 0 days.

(21) Appl. No.: 09/415,267

(22) Filed: Oct. 12, 1999

(30) Foreign Application Priority Data

May 20, 1999 (KR) ............................................. 99-18251

(51) Int. Cl.[7] .............................................. H01L 21/44
(52) U.S. Cl. ...................... 438/122; 438/106; 438/121; 438/124
(58) Field of Search ................................. 257/687, 717; 438/122, 117, 106, 118, 121, 124

(56) References Cited

U.S. PATENT DOCUMENTS

| | | | | |
|---|---|---|---|---|
| 5,723,907 A | * | 3/1998 | Akram .......................... | 257/723 |
| 5,777,379 A | * | 7/1998 | Karavakis et al. .......... | 257/668 |
| 5,834,844 A | * | 11/1998 | Akagawa et al. .......... | 257/734 |
| 6,020,220 A | * | 2/2000 | Gilleo et al. ................ | 438/119 |

* cited by examiner

Primary Examiner—Carl Whitehead, Jr.
Assistant Examiner—Christy Novacek
(74) Attorney, Agent, or Firm—Morgan, Lewis & Bockius LLP

(57) ABSTRACT

A semiconductor chip package and a method of fabricating a semiconductor chip package provide a reduced chip size package. The semiconductor chip package includes a semiconductor chip; a plurality of pads disposed on an upper surface of the semiconductor chip; a thermosetting resin formed on the upper surface of the semiconductor chip such that through-holes in the thermosetting resin expose the pads; a multi-layer wiring pattern formed on the thermosetting resin; a connecting unit electrically connecting the multi-layer wiring pattern with the pads; a solder resist on the thermosetting resin and at least on of the multi-layer wiring pattern and the connecting unit, such that at least one through-hole in the solder resist exposes a portion of at least one of the multi-layer wiring pattern and the connecting unit; and a solder ball mounted on the through-hole of the solder resist in contact with the exposed portion of the at least one of the multi-wiring pattern and the connecting unit.

15 Claims, 12 Drawing Sheets

SEMICONDUCTOR CHIP PACKAGE AND METHOD OF FABRICATING SAME

This application claims the benefit of Application No. 18251/2999, filed in Korea on May 20, 1999, which is hereby incorporated by reference.

BACKGROUND OF THE INVENTION

1. Field of the Invention

The present invention relates to a semiconductor chip package, and more particularly to a semiconductor chip package and a method of fabricating a semiconductor chip package that reduces chip size package (CSP).

2. Description of the Related Art

There is an increasing demand for small-sized and lightweight electronic system units. In order to satisfy such demands, efforts have been made to reduce the size of semiconductor chips by decreasing circuit wire width and by reducing semiconductor chip package size. The structure and fabrication method of a conventional semiconductor chip package will now be explained with reference to FIGS. 1A to 1E.

Figure 1A:
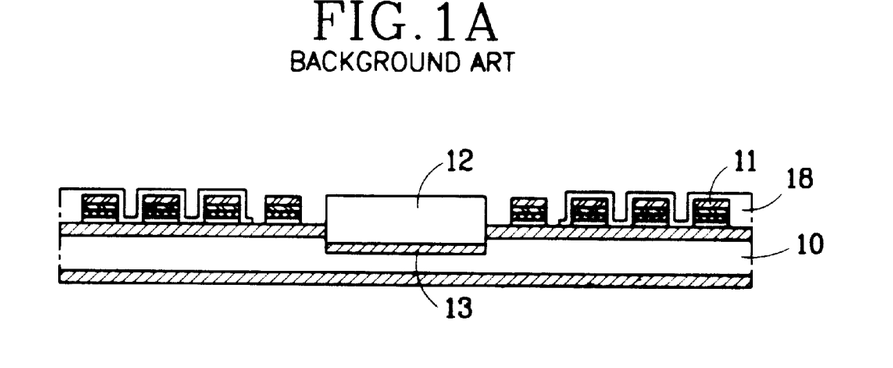
FIGS. 1A to 1E illustrate sequential steps of a process for fabricating a conventional semiconductor chip package.
Figure 1B:
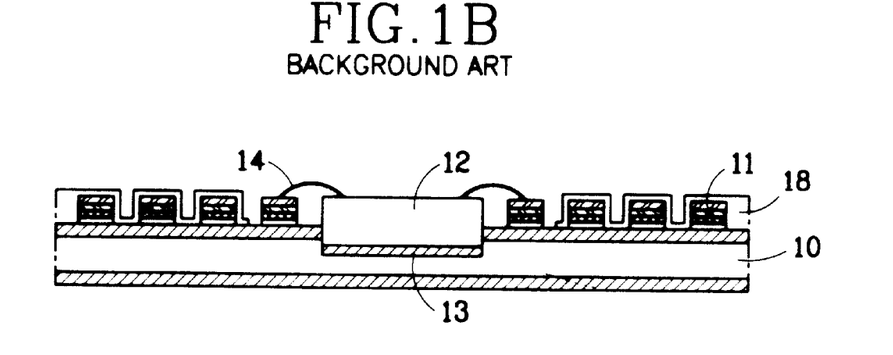
Figure 1C:
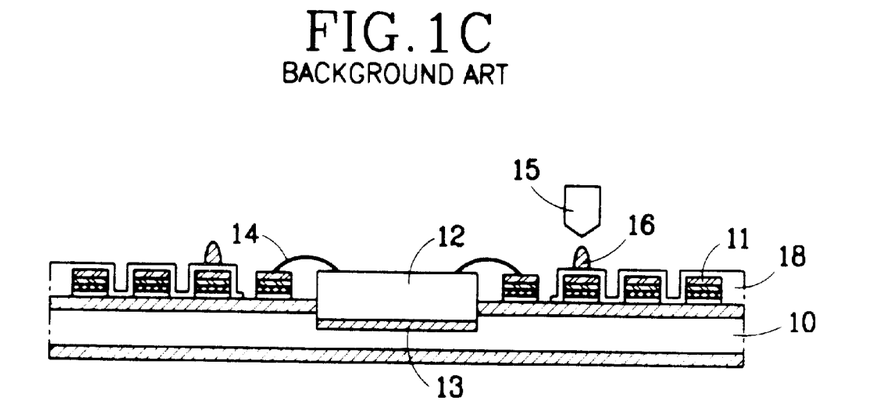
Figure 1D:
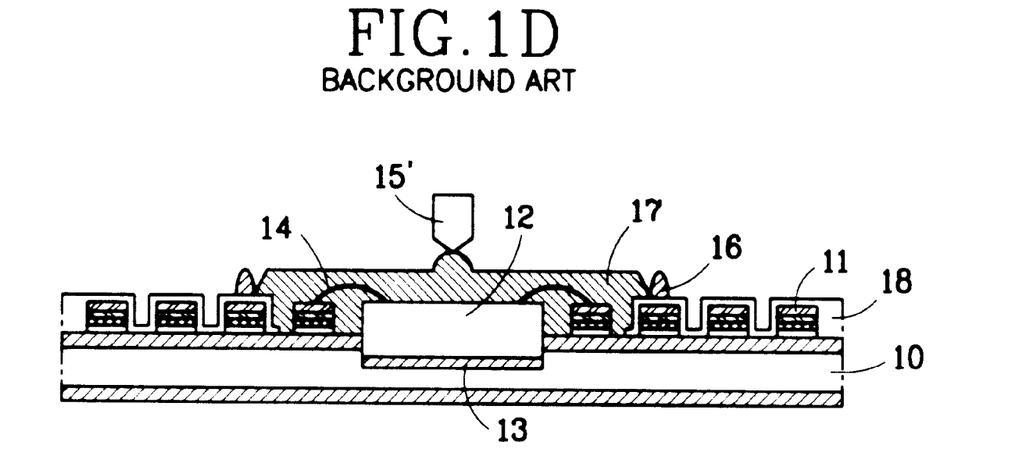
Figure 1E:
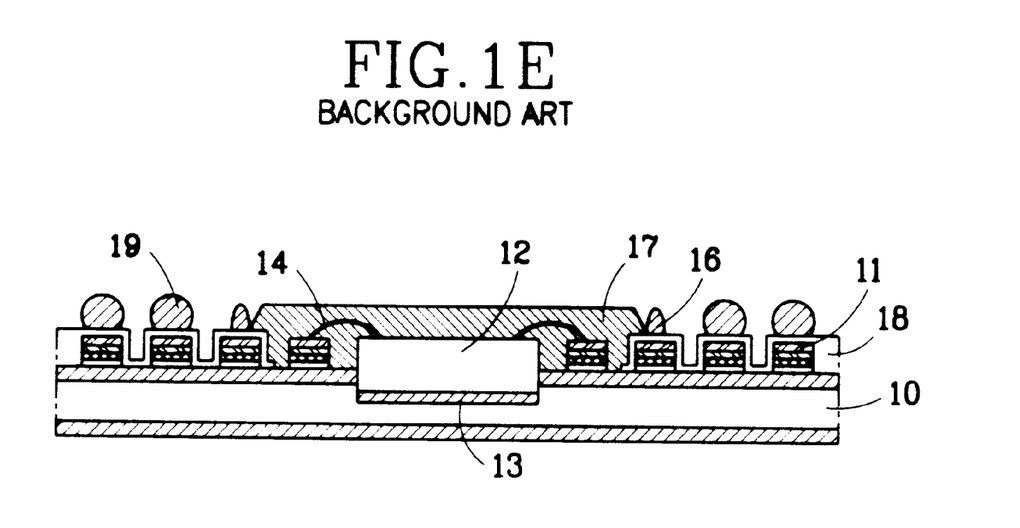

As illustrated in FIG. 1E, a semiconductor chip 12 adheres to an upper center portion of a substrate 10 of a semiconductor chip package by an adhesive 13. One side edge of a multi-layer wiring 11, which is formed on the substrate 10, is connected to a pad (not shown) on the semiconductor chip 12 by a wire 14. A liquid sealing material 17 having a high viscosity surrounds the semiconductor chip 12, the wire 14 and the one side edge of the multi-layer wiring 11. A solder resist 18 covers an upper portion of the other side edge of the multi-layer wiring 11, and a solder ball 19 is mounted on a predetermined portion thereof.

The fabrication method of the conventional semiconductor chip package as shown in FIG. 1E will now be explained.

First, as shown in FIG. 1A, the substrate 10 of the semiconductor chip package is prepared. The substrate 10 of the semiconductor chip package has a groove at its upper center portion. The multi-layer wiring 11 is formed on the substrate 10 outside the groove. The solder resist 18 covers the entire upper surface except for the one-side edge of the multi-layer wiring 11. After the substrate 10 is thus prepared, the unit semiconductor chip 12 is separated (by sawing, for example) from a wafer and is mounted on the groove of the substrate 10 using the adhesive 13.

As shown in FIG. 1B, the pad (not shown) on the upper surface of the semiconductor chip 12 is connected to the one side edge of the multi-layer wiring 11 by the wire 14.

As shown in FIG. 1C, a dam 16 is formed with a liquid resin having a sufficiently high viscosity at a predetermined portion of the multi-layer wiring 11 using a dispenser 15.

As shown in FIG. 1D, the semiconductor chip 12, the wire 14 and one side edge of the multi-layer wiring 11 inside the dam 16 are sealed by the liquid sealing material 17.

As shown in FIG. 1E, the solder resist 18 on the multi-layer wiring 11 is partially etched and removed, and a solder ball 19 is mounted thereon by a reflow process.

However, in the conventional package fabrication method, the substrate of the semiconductor package and the semiconductor chip are separately fabricated, and then the semiconductor chip is mounted on the substrate. As a result, the completed semiconductor chip package is thick and big. Thus, the semiconductor chip package does not provide small-sized and lightweight electronic systems. Also, the fabrication cost of the package also increases because the substrate for the semiconductor package is separately fabricated.

SUMMARY OF THE INVENTION

Accordingly, the present invention is directed to a semiconductor chip package and fabrication method thereof that substantially obviates one or more of the problems due to limitations and disadvantages of the related art.

An object of the present invention is to provide a semiconductor chip package having the same size as a semiconductor chip fabricated by spreading a thermosetting resin on a semiconductor chip and forming a printed circuit wiring thereon.

Another object of the present invention is to provide a fabrication method for a semiconductor chip package that improves productivity by simultaneously packaging a plurality of semiconductor chips.

Another object is to provide a fabrication method for a semiconductor chip package that is integral with a semiconductor chip.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor chip package comprises a semiconductor chip having an upper, a bottom, and side surfaces; a plurality of pads respectively disposed on portions of the upper surface of the semiconductor chip; a thermosetting resin formed on the upper surface the semiconductor chip, the thermosetting resin defining throughholes to expose the pads; a multi-layer wiring pattern formed on the thermosetting resin; a connecting unit electrically connecting the multi-layer wiring pattern with the pads; a solder resist on the thermosetting resin and at least one of the multi-layer wiring pattern and the connecting unit such that at least one through-hole exposes a portion of at least one of the multi-layer wiring pattern and the connecting unit; and a solder ball mounted on the through-hole of the solder resist in contact with the exposed portion of the at least one of the multi-wiring pattern and the connecting unit.

In another aspect, a method of fabricating a semiconductor chip package comprises the steps of preparing a wafer including a plurality of semiconductor chips having a plurality of pads on an upper surface of each semiconductor chip; spreading a thermosetting resin on the wafer; separating the respective plurality of semiconductor chips; providing a heat sink member including a metal ring frame having grooves at a side of the metal ring frame and a metal film disposed on a lower surface of the metal ring frame; mounting a wiring member chip on the heat sink member; mounting the semiconductor chip on the wiring member; the wiring member defining openings such that the pads are exposed; filling a polymer resin between the semiconductor chip and the metal film; forming a wiring pattern by patterning the wiring member; exposing the pads; forming a connection to electrically connect the pads to the wiring pattern; spreading a solder resist on the thermosetting resin and at least one of the wiring pattern and the connection; removing a portion of the solder resist to expose a portion of at least one of the wiring pattern and the connection; and mounting a solder ball on the exposed portion of the at least one of the writing pattern and the connection.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
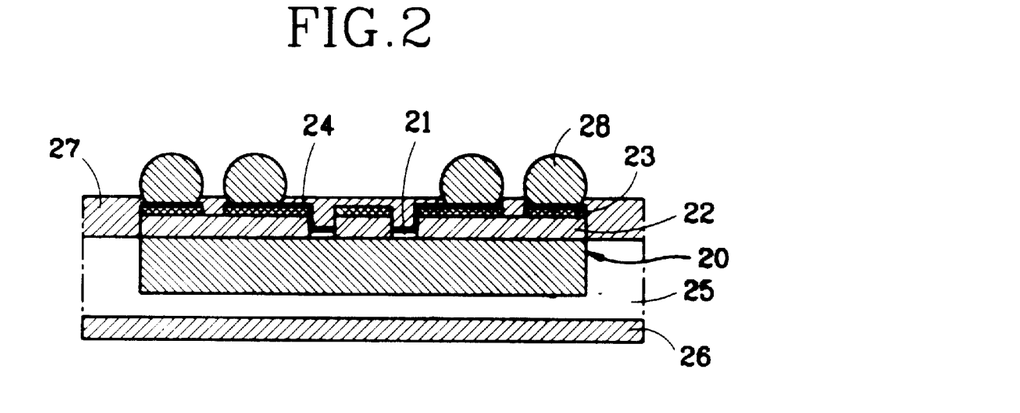
FIG. 2 is a vertical-sectional view illustrating a semiconductor chip package in accordance with an embodiment of the present invention.

FIG. 2 illustrates an embodiment of the semiconductor chip package in accordance with an embodiment of the present invention.

The semiconductor chip package of FIG. 2 includes a semiconductor chip 20 having a plurality of pads 21 at an upper center portion thereof, a thermosetting resin 22 formed on the semiconductor chip 20 except for the pads 21, a multi-layer wiring pattern 23 formed on the thermosetting resin 22 having a stacked Al/Ni/Cu structure, a conductive layer pattern 24 stacked on the multi-layer wiring pattern 23 and the pads 21 to be electrically connected to each other, a polymer resin 25 surrounding both side and bottom portions of the semiconductor chip, a metal film to act as a heat sink 26 disposed at a lower portion of the polymer resin, a solder resist 27 covering an entire surface of the semiconductor substrate except for a predetermined portion of the conductive layer pattern 24, and a solder ball 28 mounted at a predetermined portion of the conductive layer pattern 24.

Figure 3:
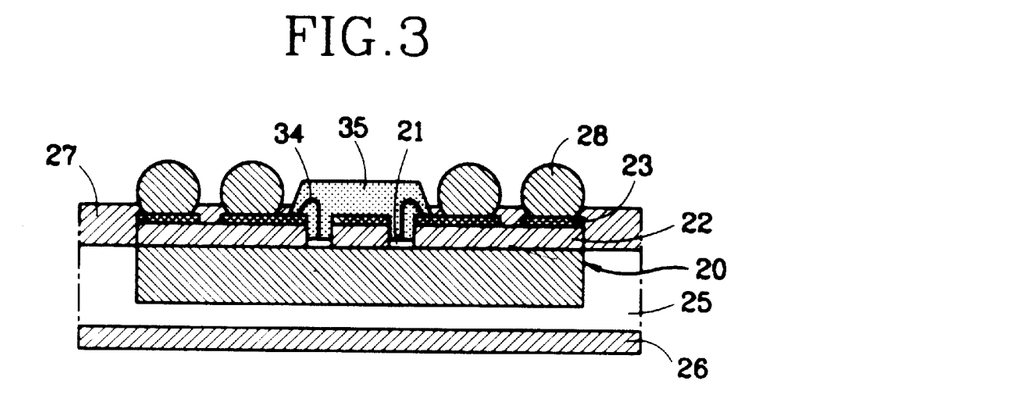
FIGS. 3 and 4 are vertical-sectional views illustrating a semiconductor chip package in accordance with additional embodiments of the present invention.

In an alternative embodiment shown in FIG. 3, the conductive layer pattern 24 may be replaced by a metal wire 34 in the semiconductor package. Here, a sealing unit 35 surrounding the pads 21 and the wire 34 is further provided. Except for the metal wire 34 and the sealing unit 35, the configuration of the device of FIG. 3 is generally similar to that of FIG. 2.

Figure 4:
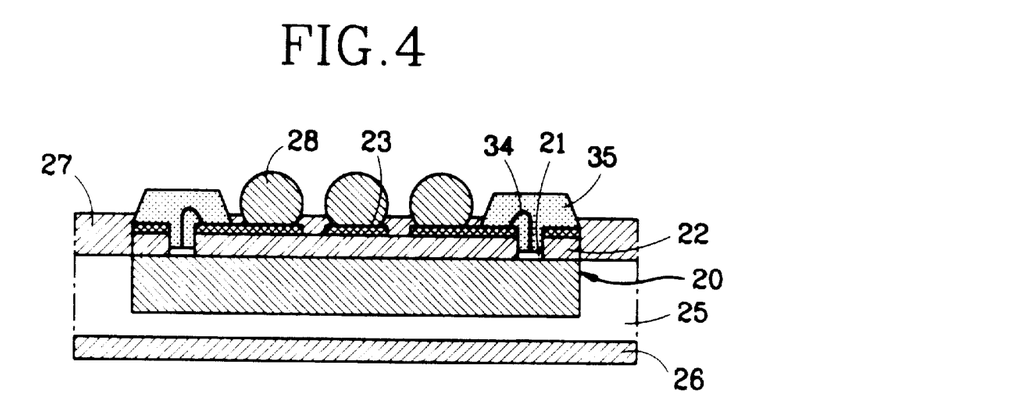

In yet another alternative embodiment shown in FIG. 4, the pads may be formed at an upper edge portion of the semiconductor chip, instead of its upper center portion. Here, the configuration of the device of FIG. 4 is generally similar to those of FIGS. 2 and 3. Of course, other configurations and variations may be used in accordance with the present invention.

A method of fabricating the semiconductor chip package in accordance with the present invention will now be described. First, various members and devices used in fabricating the semiconductor chip package of the present invention will be explained.

Figure 5A:
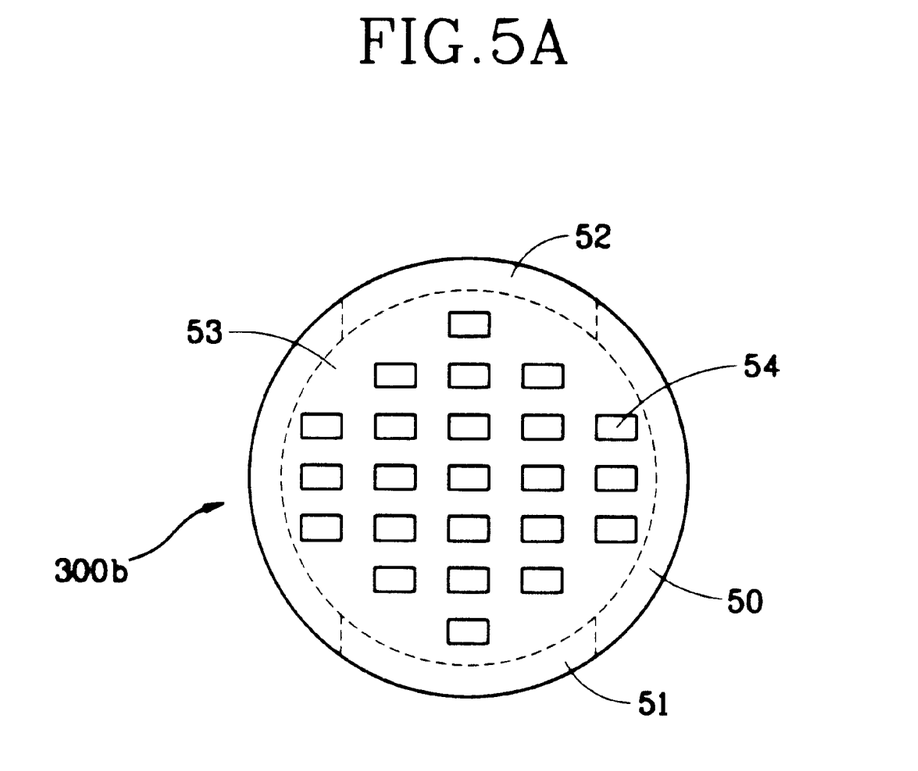
FIGS. 5A and 5B are respectively a plan view and a front view illustrating a member for a multi-layer wiring used for fabricating the semiconductor chip package in accordance with an embodiment of the present invention.
Figure 5B:
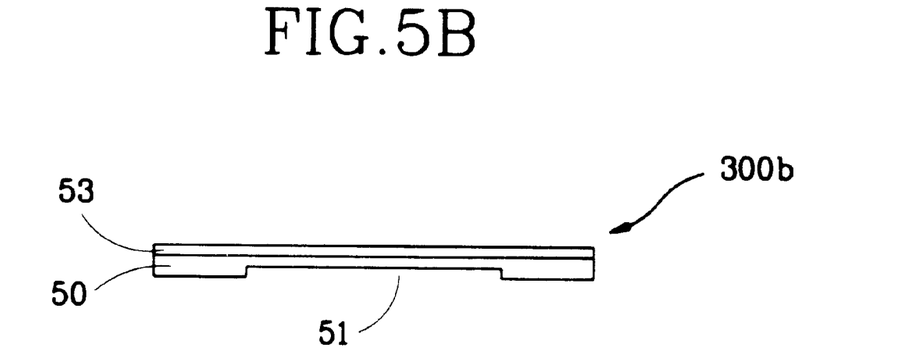

FIGS. 5A and 5B respectively show a plan view and a front view illustrating a structure of the wiring member 300b to be prepared. Here, the wiring member 300b includes a ring-type frame 50 and an aluminum foil 53 adhered to an upper portion of the ring-type frame 50 and having a thickness of 0.5 to 10 μm. At least two grooves 51, 52 are formed at a lower portion of the ring-type frame 50. A plurality of openings 54 are formed on the aluminum foil 53. The positions of the openings 54 correspond to those of the pads respectively formed at the upper portions of the semiconductor chips on the wafer, the openings 54 are sufficiently large to each respectively surround the pads of the semiconductor chips. That is, when the supporting member 300b and the wafer are aligned, each pad of the semiconductor chips can be shown through the openings 54.

Figure 6A:
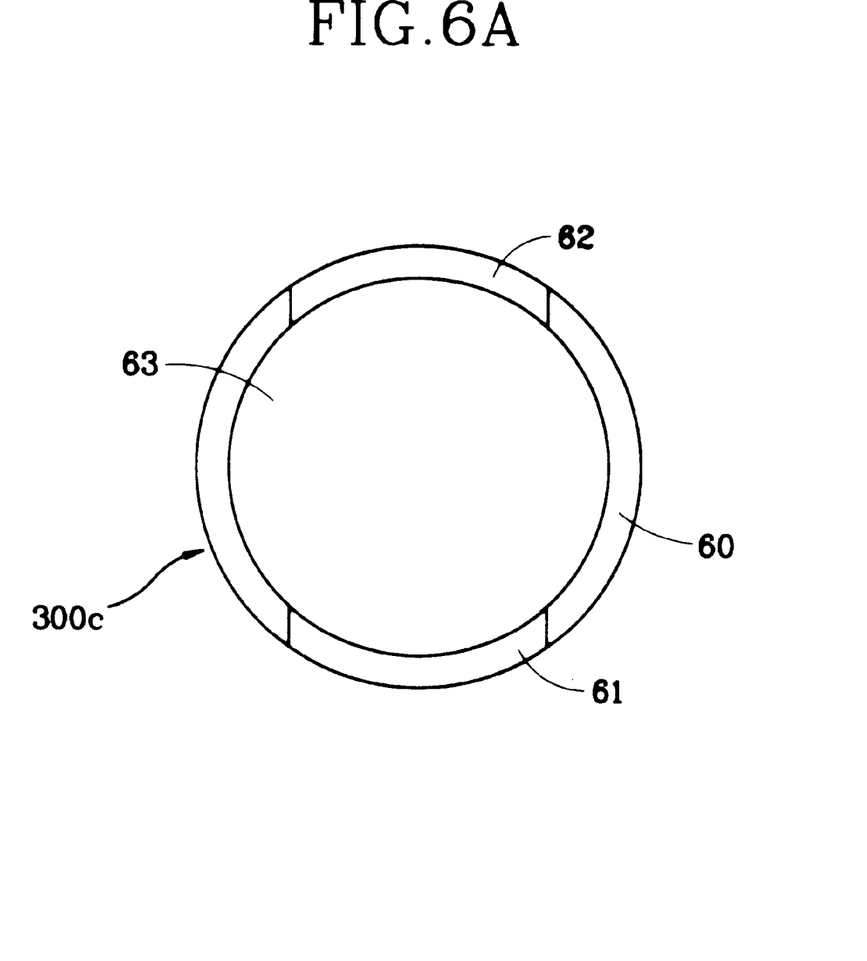
FIGS. 6A and 6B are respectively a plan view and a front view illustrating a member for a heat sink member used in the fabrication of the semiconductor chip package in accordance with an embodiment of the present invention.
Figure 6B:
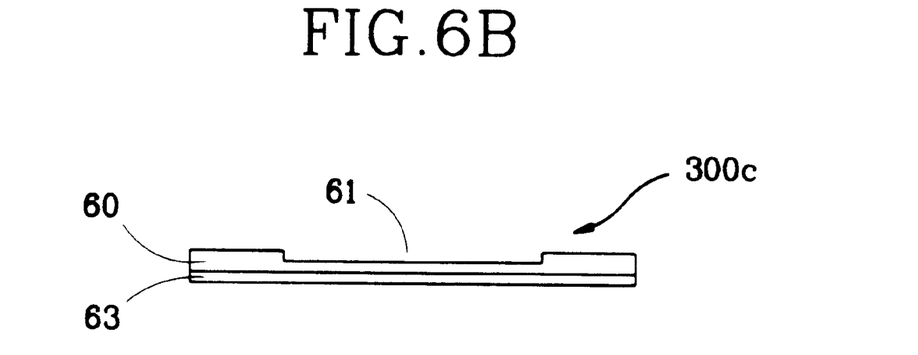

FIGS. 6A and 6B are respectively plan and front views illustrating a heat sink member 300c. A heat sink member 300c as shown in FIGS. 6A and 6B is fabricated and implemented into the semiconductor chip package. The heat sink member 300c includes a metal ring frame 60 and a metal film 63, such as Al or Cu, having a thickness of 50 to 300 μm adhered to a lower portion of the metal ring frame 60. At least two grooves 61, 62 are formed at an upper portion of the ring-type frame 60. Preferably, the positions of the grooves 61, 62 correspond to the grooves 51, 52 of the wiring member 300b.

Figure 7:
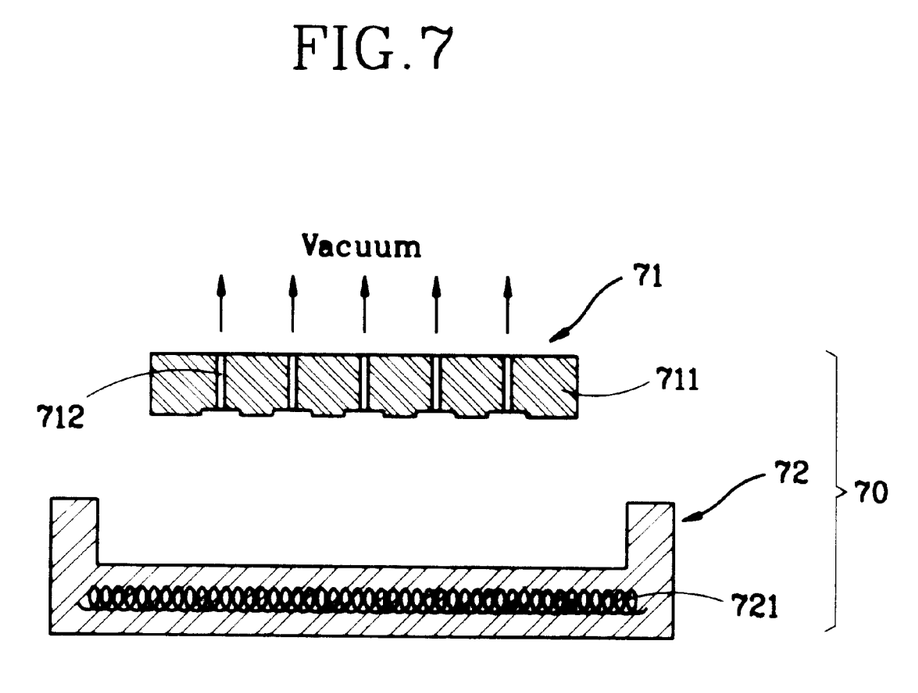
FIG. 7 is a schematic diagram of a heater block used in the fabrication of the semiconductor chip package in accordance with an embodiment of the present invention.

As depicted in FIG. 7, a heater block 70 is prepared. The heater block 70 will be used to fix and heat the semiconductor chip during the packaging process. Here, the heater block 70 includes an upper block 71 and a lower block 72. A heating device 721 is provided in the lower block 72. The upper block 71 generally has a solid body 711 with a plurality of through holes 712. Here, the upper edge portions of the through holes 712 are connected to a vacuum suction unit.

A method of fabricating the semiconductor chip package in accordance with the present invention will now be described with reference to FIGS. 8A to 8K.

Figure 8A:
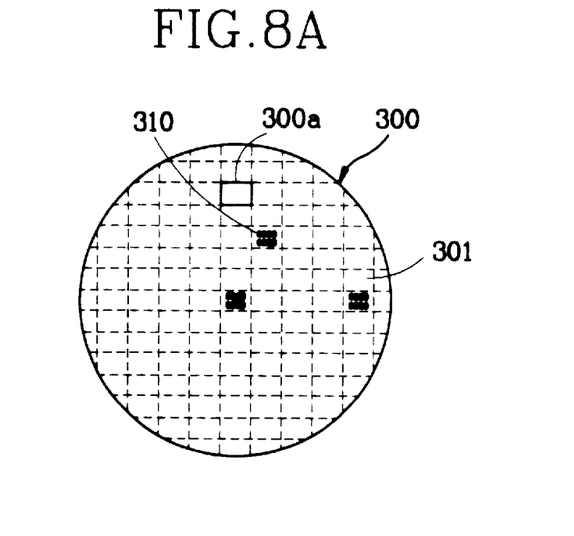
FIGS. 8A to 8K illustrate sequential steps of a process for fabricating the semiconductor chip package in accordance with an embodiment of the present invention.

First, a wafer 300 is prepared. A plurality of semiconductor chips 300a are formed on the wafer 300 each having a plurality of pads 310 at its upper portion. As shown in FIG. 8A, in order to obtain a stress relaxation effect, a coating 301, such as benzocyclo butene (BCB) or a silicone-group thermosetting resin, having a low elastic modulus and a high thermal expansive coefficient is spread over the wafer 300 having the plurality of semiconductor chips 300a with a thickness of 50 to 200 μm using a spin-coating process.

Figure 8B:
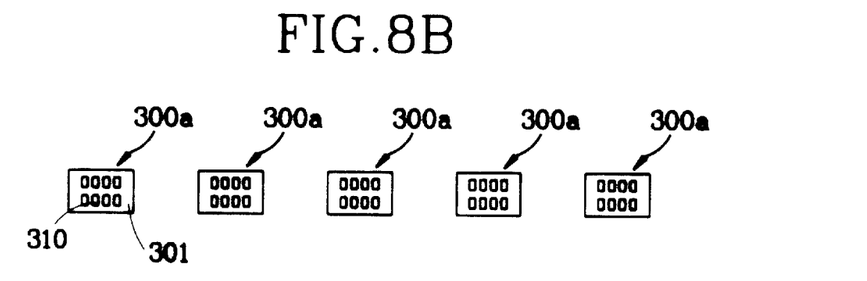

Here, if a thermosetting resin is used, a sol-type thermosetting resin is preferred. The sol-type thermosetting resin coating 301 is heated at a temperature of approximately 250° C. and softly cured to reach a B-stage state (30 to 50% of the resin is cured; gel type). Thereafter, a sawing process is used to cut the wafer 300, and thus the semiconductor chips 300a, into unit chips.

Figure 8C:
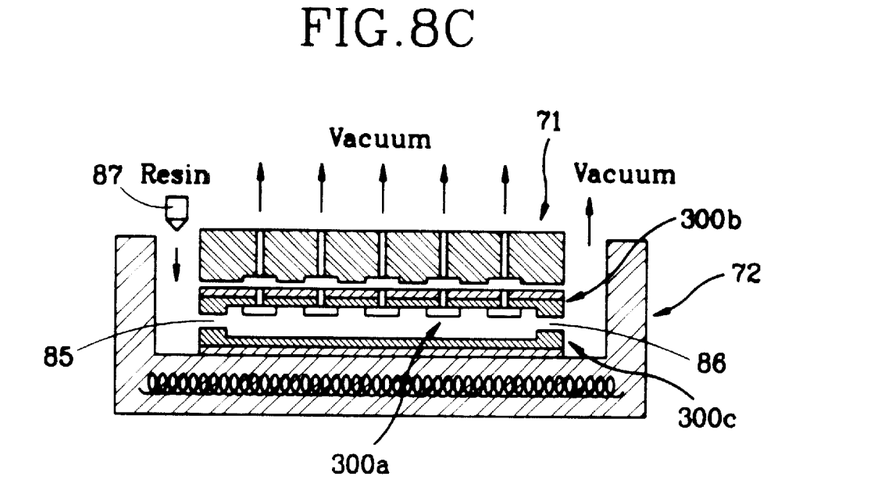

Referring to FIG. 8C, the heat sink member 300c is provided on the lower block 72 of the heater block 70. The wiring member 300b and the semiconductor chip 300a are fixed to the upper block 71 of the heater block 70. That is, the aluminum foil of the wiring member 300b and the semiconductor chip 300a are fixed to the upper block 71 using vacuum suction through the through holes 712. Here, the wiring member 300b and the semiconductor chip 300a are also aligned so that the pads of the semiconductor chip 300a can enter into the openings 54.

Then, as further shown in FIG. 8C, the member for wiring 300b and the semiconductor chips 300a are positioned on the heat sink member 300c. The grooves 51, 52 of the wiring member 300b and the grooves 61, 62 of the heat sink member 300c are aligned in order to face each other in an identical position. As a result, a protrusion of the ring-type frame of the wiring member 300b is connected to a protrusion of the metal ring frame of the heat sink member 300c, and the grooves 51, 61 and the grooves 52, 62 are respectively connected to each other, thereby forming resin implanting holes 85, 86. A surface of the lower block 72 of the heater block 70 is larger than the member for the heat sink 300c, thereby forming a space between a side wall of the lower block 72 of the heater block 70 and the heat sink member 300c. The heater block 70 is heated at a temperature between 150 and 350° C. for 30 minutes to 5 hours using the heating device therein. Here, the thermosetting resin in the B-stage state spread on the semiconductor chip 300a is completely cured by the heater block 70 and firmly adhered to the aluminum foil of the member for wiring. The vacuum suction is carried out from a space at one side, and the polymer resin, such as Ultem (brand name of a polymer sold by General Electrics) or silicone, is implanted via the space at the other side. The vacuum suction is used to remove air bubbles generated in the polymer resin. Here, the polymer resin flows to and fills the space between the semiconductor chip 300a and the heat sink member 300c through the resin implanting holes 85, 86 by a capillary phenomenon.

Figure 8D:
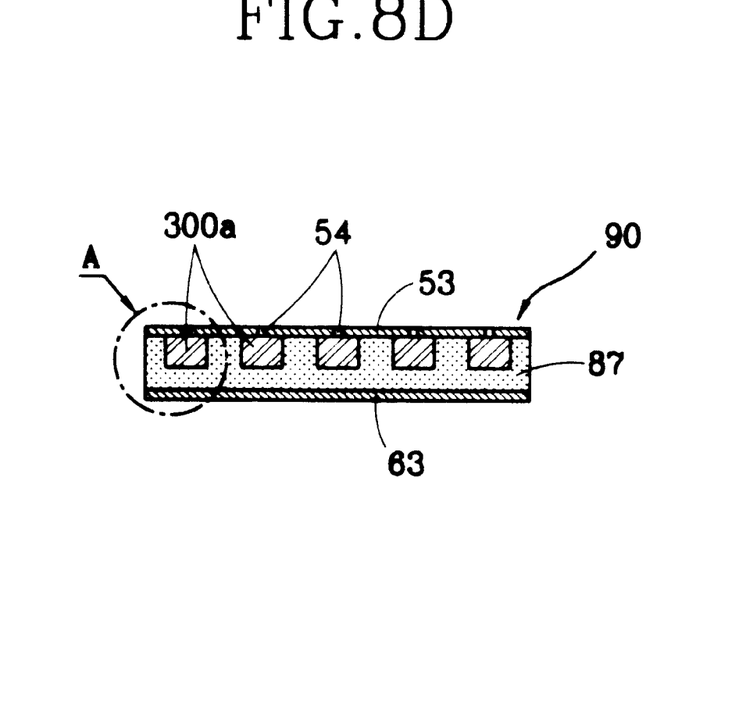
Figure 8E:
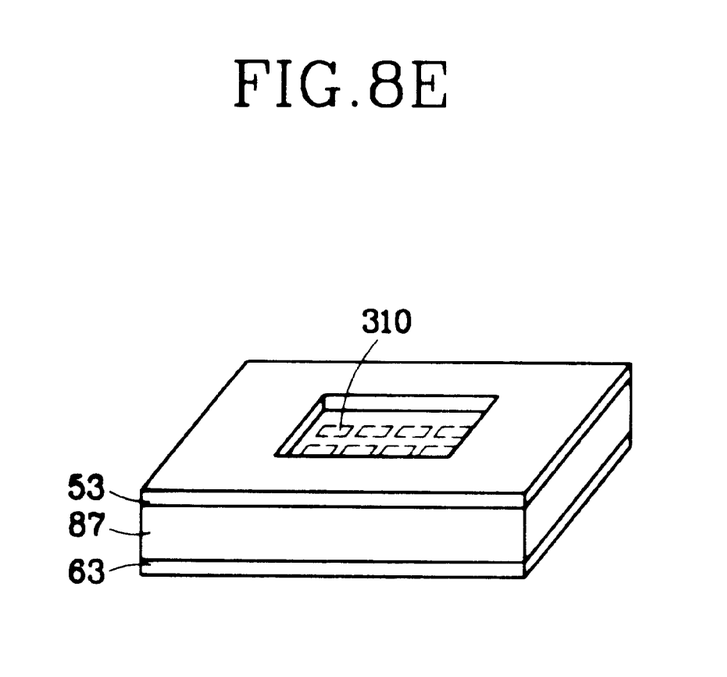

As shown in FIG. 8D, a structure 90 having the wiring member 300b, the semiconductor chip 300a, and the heat sink member 300c as a single body is taken out of the heater block 70. Here, the metal film 63 of the heat sink member 300c is positioned at the bottom surface, the polymer resin 87 is positioned on the metal film 63, and the plurality of semiconductor chips 300a are positioned in the polymer resin 87. The aluminum foil 53 adheres to the upper portions of the semiconductor chips 300a and the polymer resin 87. The plurality of openings 54 are formed in the aluminum foil 53. FIG. 8E shows an enlarged perspective view of portion A of FIG. 8D.

Figure 8F:
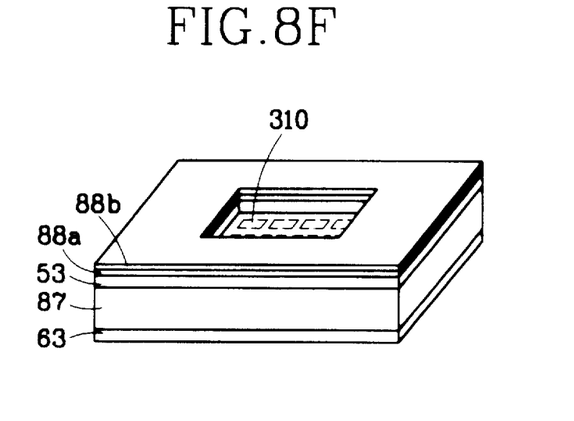
Figure 8G:
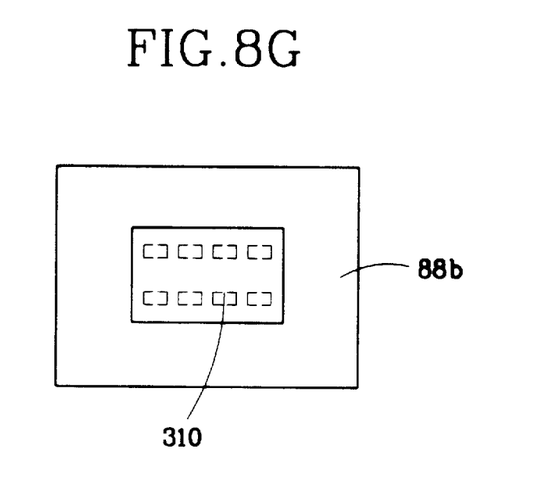

As shown in FIG. 8F, a nickel (Ni) layer 88a and a copper (Cu) layer 88b are formed on the aluminum foil 53 by an electroplating process. FIG. 8G is a plan view of FIG. 8F.

A photoresist pattern (not shown) is formed on the copper layer 88b. The photoresist pattern corresponds to a pattern for wiring for adhering the solder ball. After the copper layer 88b, the nickel layer 88a and the aluminum foil 53 are sequentially etched using the photoresist pattern as a mask. The photoresist pattern is then removed, thereby forming a multi-layer pattern 90 as shown in FIG. 8H and exposing the upper portion of the thermosetting resin on the semiconductor chip 300a.

Figure 8H:
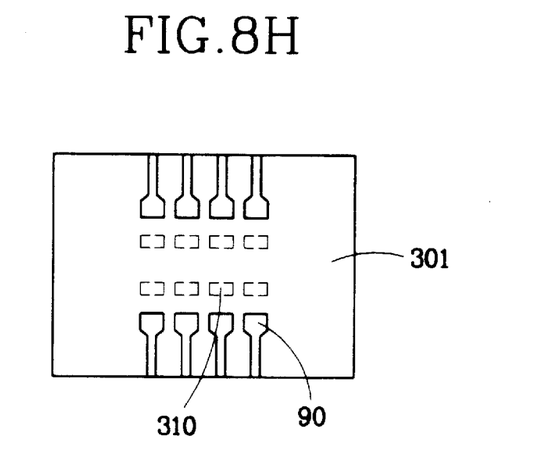
Figure 8I:
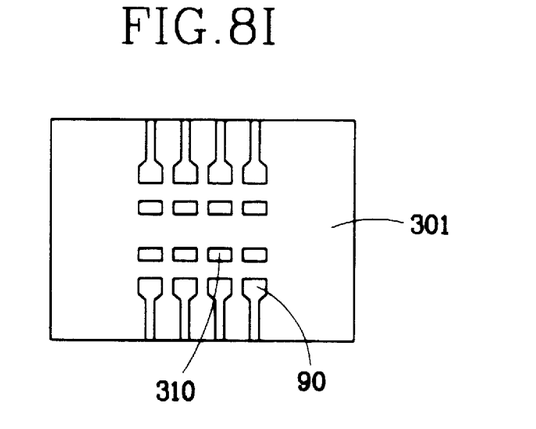

As shown in FIG. 8I, photo-lithography and etching are used to remove thermosetting resin on the pads 310, thereby exposing the pads 310.

A photoresist mask (not shown) is formed on the entire resultant structure of FIG. 8H except for the multi-layer wiring pattern 90, the pads 310, and spaces therebetween. A metal pattern 91 is formed on the multi-layer wiring pattern 90 and the pads 310 by accumulating a metal, such as Al or Au, using sputtering. The multi-layer wiring pattern 90 and the pads 310 are electrically connected by accumulation of the metal pattern 91. The photoresist mask is then removed, thereby forming a structure as shown in FIG. 8J.

Figure 8J:
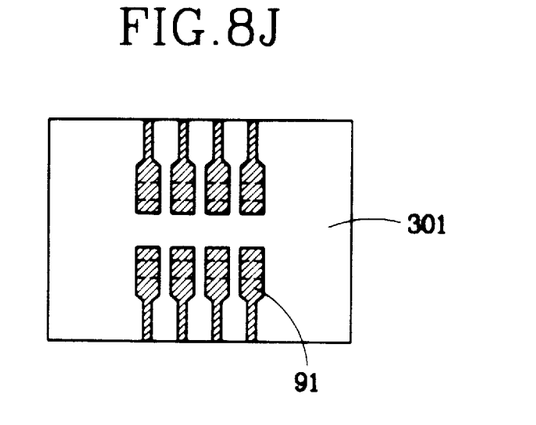
Figure 9A:
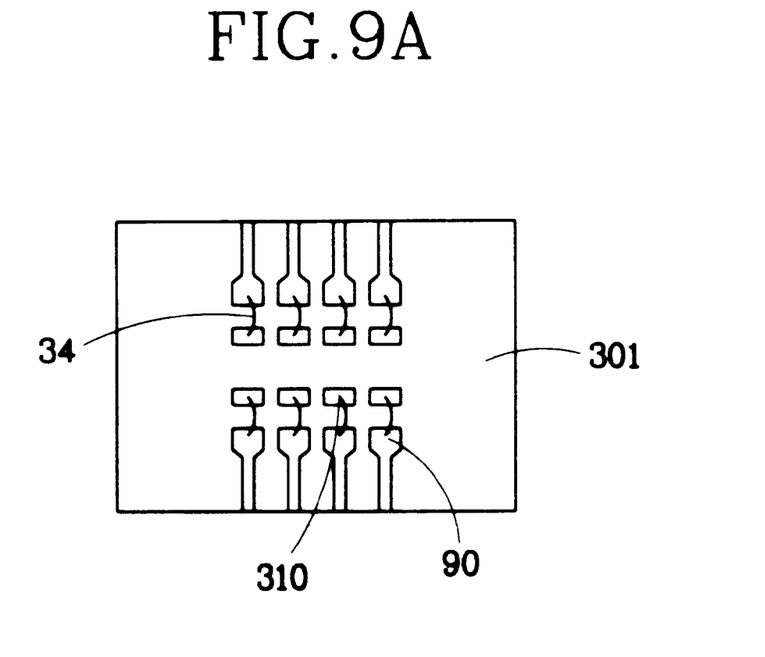
FIGS. 9A and 9B illustrate sequential steps of a process as an alternative to the process of FIG. 8I.
Figure 9B:
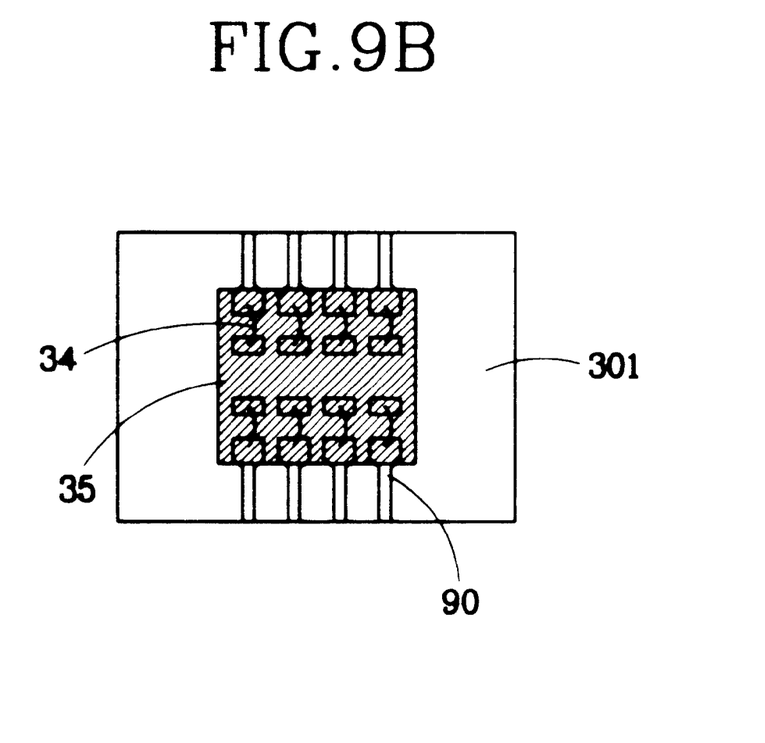

As one alternative to the process of FIG. 8J, as shown in FIG. 9A, the process of accumulating the metal pattern 91 may be replaced by a wiring process of connecting the upper portions of the pads 310 to the one side edge of the multi-layer wiring pattern 90 by a metal wire 34. After the wiring process is finished, the wire 34, the pads, and the one side edge of the multi-layer wiring pattern 90 are covered with the liquid resin 35 having a high viscosity as shown in FIG. 9B. Thus, the processes of FIG. 8J can be replaced by the processes of FIGS. 9A and 9B.

Figure 8K:
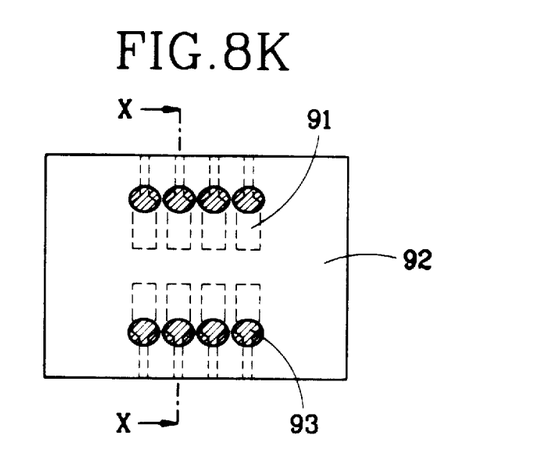

Thereafter, as shown in FIG. 8K a solder resist film 92 is spread on the entire resultant structure of FIG. 8J. Then, the solder resist film 92 is removed at predetermined portions of the metal patterns 91 by photo-lithography and etching, thereby exposing the predetermined portions of the metal patterns 91. After the process as shown in FIG. 8J is carried out on the plurality of semiconductor chips, a singulation process of dividing the semiconductor chips into the respective semiconductor chip packages by sawing is performed. Next, solder balls 93 are mounted on the predetermined exposed portions of the multi-layer wiring pattern 90 and reflowed. As a result, a semiconductor chip package as shown in FIG. 8K is fabricated.

Figure 10:
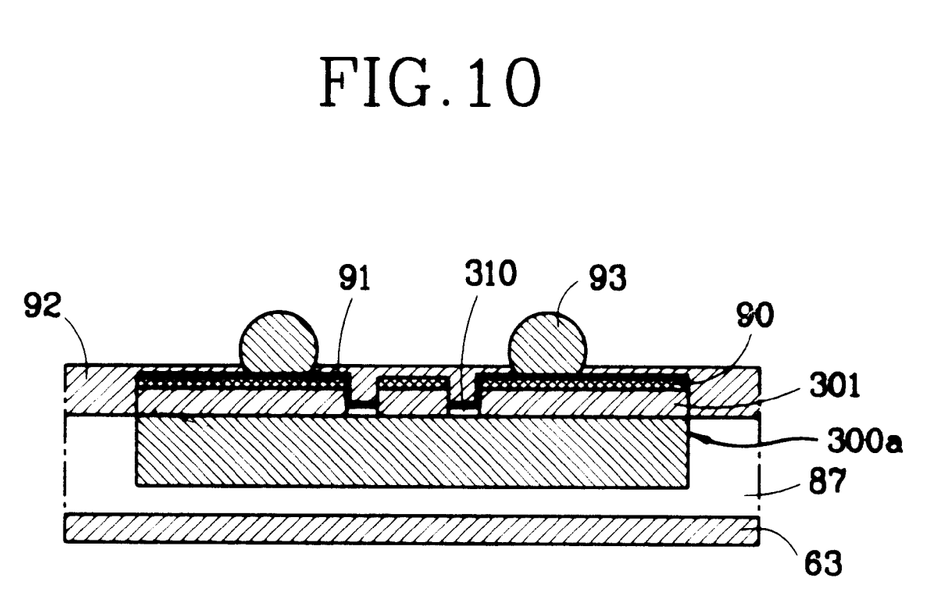
FIG. 10 is a vertical-sectional view of the completed semiconductor chip package of FIG. 8K.

FIG. 10 shows a vertical-sectional view taken along line X—X in FIG. 8K. Hence, the semiconductor chip package in accordance with an embodiment of the present invention includes the semiconductor chip 300a having the plurality of pads 310 at its upper center portion, the thermosetting resin 301 formed on the semiconductor chip 300a except for the pads 310, the multi-layer wiring pattern 90 formed on the thermosetting resin 301 and having a stacked Al/Ni/Cu structure, the metal patterns 91 disposed on the multi-layer wiring pattern 90 and the pads 310 to be electrically connected to each other, the polymer resin 87 surrounding both side and bottom portions of the semiconductor chip, the metal film using the heat sink 63 adhered to the lower portion of the polymer resin 87, the solder resist 92 covering the entire semiconductor substrate except for a predetermined portion of the metal pattern 91, and a solder ball 93 adhered to a predetermined portion of the metal pattern 91.

The present invention provides a reduced chip package size, thereby reducing an area of the package on a printed wiring board. Hence, the present invention enables small-sized and lightweight electronic system units.

Moreover, the semiconductor chip package of the present invention allows considerably smaller sized solder balls as output terminals as compared to conventional devices. Thus, high pin density and a greater number of pins are enabled. Since the printed wiring board and the semiconductor chip pads are connected by the solder balls, a connection distance (conductive path) will be short, thereby improving electrical characteristics.

Furthermore, in accordance with embodiments of the present invention, because the semiconductor chips on the single wafer are packaged at one time, packaging speed is improved, thereby improving productivity.

In addition, the heat sink is provided at the lower portion of the package, thereby enabling high power applications.

It will be apparent to those skilled in the art that various modifications and variations can be made in the semiconductor chip package and fabrication method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor chip package, comprising the steps of:

preparing a wafer including a plurality of semiconductor chips having a plurality of pads on an upper surface of each semiconductor chip;

spreading a thermosetting resin on the wafer;

separating the respective plurality of semiconductor chips;

providing a heat sink member including a metal ring frame having grooves at a side of the metal ring frame and a metal film disposed on a lower surface of the metal ring frame;

mounting a wiring member on the heat sink member;

mounting the semiconductor chip on the wiring member, the wiring member defining openings such that the pads are exposed;

filling a polymer resin between the semiconductor chip and the metal film;

forming a wiring pattern by patterning the wiring member;

exposing the pads;

forming a connection to electrically connect the pads to the wiring pattern;

spreading a solder resist on the thermosetting resin and at least one of the wiring pattern and the connection;

removing a portion of the solder resist to expose a portion of at least one of the wiring pattern and the connection; and mounting a solder ball on the exposed portion of the at least one of the wiring pattern and the connection, wherein the step of filling the polymer resin between the semiconductor chip and the metal film is conducted before the step of forming the connection to electrically connect the pads to the wiring pattern.

2. The method according to claim 1, wherein the wiring member includes a ring frame having grooves at a lower side portion, and an aluminum foil adhered to an upper surface of the ring frame.

3. The method according to claim 2, wherein the step for mounting the wiring member on the semiconductor chip includes the step of aligning the wiring member and the heat sink member such that the grooves of the wiring member and the grooves of the heat sink each other.

4. The method according to claim 3, wherein the step for implanting the polymer resin includes the step of implanting the resin through a resin implanting hole defined by connecting the groove of the wiring member and the groove of the heat sink member.

5. The method according to claim 2, wherein a nickel layer and a copper layer are formed on the wiring member before the step for forming the wiring pattern.

6. The method according to claim 5, wherein the nickel layer and the copper layer are formed using an electroplating process.

7. The method according to claim 5, wherein the step for forming the wiring pattern and the step for patterning the nickel layer and the copper layer are performed at the same time.

8. The method according to claim 1, wherein the step for forming the connection includes the steps of forming a photoresist pattern on a surface of the semiconductor chip such that the wiring pattern, the pads and spaces between the wiring pattern and the pads remain exposed, and forming a metal pattern on the wiring pattern, the pads and the spaces between the wiring pattern and the pads.

9. The method according to claim 8, wherein the step for forming the metal pattern includes sputtering.

10. The method according to claim 1, wherein the step for forming the connection includes a wiring process to connect the wiring pattern to the pads by a metal wire.

11. The method according to claim 10, further comprising a step of partially sealing the pads and the wiring pattern with a sealing material after the wiring process.

12. The method according to claim 11, further comprising a step of converting the thermosetting resin to a B-state by softly curing the thermosetting resin, after the step of spreading the thermosetting resin on the semiconductor chip.

13. The method according to claim 1, further comprising a step for maintaining the semiconductor chip in the heater block at a temperature of 150 to 350° C. for a time period between 30 minutes and 5 hours before the step for filling the polymer resin between the semiconductor chip and the metal film.

14. The method according to claim 1, wherein the polymer resin includes at least one of a benzocyclo-butene (BCB) and a silicone-group resin.

15. The method according to claim 1, wherein the separating step includes the step of sawing the wafer.

* * * * *